United States Patent
Okamura (10) Patent No.: US 11,059,974 B2
(45) Date of Patent: Jul. 13, 2021

(54) SILICON CARBONACEOUS FILM FORMING COMPOSITION COMPRISING POLYCARBOSILANE AND METHOD FOR MANUFACTURING SILICON CARBONACEOUS FILM USING THE SAME

(71) Applicant: Merck Patent GmbH, Darmstadt (DE)

(72) Inventor: Toshiya Okamura, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 16/634,183

(22) PCT Filed: Aug. 7, 2018

(86) PCT No.: PCT/EP2018/071342
§ 371 (c)(1),
(2) Date: Jan. 27, 2020

(87) PCT Pub. No.: WO2019/030206
PCT Pub. Date: Feb. 14, 2019

(65) Prior Publication Data
US 2020/0385581 A1    Dec. 10, 2020

(30) Foreign Application Priority Data

Aug. 10, 2017 (JP) .............................. JP2017-155482

(51) Int. Cl.
| | | |
|---|---|---|
| *C09D 183/16* | (2006.01) | |
| *C08G 77/60* | (2006.01) | |
| *C08L 83/16* | (2006.01) | |
| *C08G 77/32* | (2006.01) | |

(52) U.S. Cl.
CPC .............. *C08L 83/16* (2013.01); *C08G 77/32* (2013.01); *C08G 77/60* (2013.01); *C09D 183/16* (2013.01); *C08L 2203/16* (2013.01)

(58) Field of Classification Search
CPC ...... C08G 77/60; C09D 183/16; C08L 183/16
See application file for complete search history.

(56) References Cited

U.S. PATENT DOCUMENTS

| | | |
|---|---|---|
| 4,052,430 A | 10/1977 | Yajima et al. |
| 5,602,060 A | 2/1997 | Kobayashi et al. |
| 2017/0015789 A1* | 1/2017 | Li .......................... C08G 77/60 |

FOREIGN PATENT DOCUMENTS

| | | |
|---|---|---|
| JP | H07118007 A | 5/1995 |
| JP | 2008210929 A | 9/2008 |

OTHER PUBLICATIONS

Abstract for CN 102120822 (Jul. 2011).*
Abstract for CN 106752938 (May 2017).*
Abstract for RU 2410401 (Jan. 2011).*
Abstract for CN 106633080 (May 2017).*
International Preliminary Report on Patentability for PCT/EP2018/071342 dated Oct. 25, 2018.

* cited by examiner

*Primary Examiner* — Marc S Zimmer
(74) *Attorney, Agent, or Firm* — Faegre Drinker Biddle & Reath LLP (57) ABSTRACT

[Problem] To provide a composition comprising polycarbosilane, which has excellent filling property, can form a film at a lower temperature, and makes electrical property of the produced film excellent. [Means for Solution] A silicon carbonaceous film forming composition comprising polycarbosilane and a solvent, wherein the ratio of the integrated intensity at 3.92 to 4.20 ppm to the integrated intensity at 3.60 to 5.50 ppm in the H-NMR spectrum of said polycarbosilane is 27 to 50%.

17 Claims, 3 Drawing Sheets

SILICON CARBONACEOUS FILM FORMING COMPOSITION COMPRISING POLYCARBOSILANE AND METHOD FOR MANUFACTURING SILICON CARBONACEOUS FILM USING THE SAME

CROSS-REFERENCE TO RELATED APPLICATIONS

This application is a national stage application (under 35 U.S.C. § 371) of PCT/EP2018/071342, filed Aug. 7, 2018, which claims benefit of Japanese Application No, 2017-155482, filed Aug. 10, 2017, both of which are incorporated herein by reference in their entirety.

BACKGROUND OF THE INVENTION

Technical Field

The present invention relates to a silicon carbonaceous film forming composition comprising a polycarbosilane. Further, the present invention relates to methods for manufacturing a cured film using the same and for producing a device having the cured film, as well as a method for producing the polycarbosilane.

Background Art

In the field of electronic devices, especially semiconductor devices, the device rule has been gradually miniaturized, and the size of an insulating structures and the like separating each element to be incorporated in the device is also required to be miniaturized. An interlayer insulating film is formed in such an insulating structure, but various characteristics such as planarity and insulating characteristics are required for the insulating film. As a method for forming an insulating film more easily, a forming method using various coating materials including organic and inorganic materials has been proposed. One of them is a composition containing a polycarbosilane. A silicon carbonaceous material obtained by heat-treating polycarbosilane is excellent in heat resistance and used not only as an insulating film but also as an etching stopper and a hard mask.

With the progress of the miniaturization of the insulating structure, there has been a demand for a material which is more excellent in filling property and can achieve global planarity with respect to the concavo-convex structure. Further, considering the influence on the device, there has been also a demand for a material which can be formed at a lower temperature and makes electrical property of the produced film excellent.

PRIOR ART DOCUMENTS

Patent Documents

[Patent document 1] JP-A 1995-118007
[Patent document 2] JP-A 2008-210929

SUMMARY OF THE INVENTION

Means for Solving the Problems

The present invention has been made based on the above circumstances, and it is an object of the present invention to provide a composition comprising polycarbosilane, which has excellent filling property, can form a film at a lower temperature, and makes electrical property of the produced film excellent.

The composition according to the invention is a silicon carbonaceous film forming composition comprising polycarbosilane and a solvent, wherein the ratio of the integrated intensity of 3.92 to 4.20 ppm to the integrated intensity of 3.60 to 5.50 ppm in the $^1$H-NMR spectrum of the polycarbosilane is 27 to 50%.

Further, the method for producing a silicon carbonaceous film according to the present invention is characterized by comprising applying the above-described composition on a substrate and curing by heating.

Further, the method for producing an electronic device according to the present invention is characterized by comprising the above-described method for producing a silicon carbonaceous film.

Further, the method for producing the polycarbosilane according to the present invention is characterized by comprising a step of heat-treating polydimethylsilane under the condition of 0.15 to 0.9 MPa and at 700° C. or more.

Effects of the Invention

According to the present invention, a silicon carbonaceous film forming composition excellent in filling property is provided. Using this composition, a silicon carbonaceous film exhibiting excellent electrical property can be produced at a lower temperature than before.

DETAILED DESCRIPTION OF THE INVENTION

Mode for Carrying Out the Invention

Embodiments of the present invention are described in detail below.

In the present specification, when numerical ranges are indicated using "to", unless otherwise specifically mentioned, they include both endpoints, and units thereof are common. For example, 5 to 25 mol % means 5 mol % or more and 25 mol % or less.

In the present specification, the descriptions such as "$C_{x-y}$", "$C_x$-$C_y$" and "$C_x$" mean the number of carbons in the molecule or substituent. For example, $C_{1-6}$ alkyl means alkyl having 1 or more and 6 or less carbons (methyl, ethyl, propyl, butyl, pentyl, hexyl etc.). In the present specification, "fluoroalkyl" refers to one in which one or more hydrogens in alkyl are replaced with fluorine, and "fluoroaryl" refers to one in which one or more hydrogens in aryl are replaced with fluorine.

In the present specification, unless specifically referred, "alkyl" means a linear or branched alkyl, and "cycloalkyl" means alkyl containing a cyclic structure. Those in which a cyclic structure is substituted with a linear or branched alkyl are also referred to as cycloalkyl. Further, "hydrocarbyl group" means a monovalent or divalent or higher group comprising carbon and hydrogen, and optionally containing oxygen or nitrogen. Further, "aliphatic hydrocarbyl group" means a linear, branched or cyclic aliphatic hydrocarbyl group, and "aromatic hydrocarbyl group" contains an aromatic ring and optionally has an aliphatic hydrocarbyl group as a substituent. These aliphatic hydrocarbyl groups and aromatic hydrocarbyl groups optionally contain fluorine, oxy, hydroxy, amino, carbonyl, or silyl etc.

In the present specification, when polymer has plural types of repeating units, these repeating units copolymerize. Unless specifically referred, these copolymerizations are any of alternating copolymerization, random copolymerization, block copolymerization, graft copolymerization, or a mixture thereof.

In the present specification, unless specifically referred, Celsius is used as the temperature unit. For example, 20 degrees means 20 degrees Celsius.

<Composition>

The silicon carbonaceous film forming composition according to the present invention (hereinafter sometimes referred to as "composition") comprises a specific polycarbosilane and a solvent. Each component contained in the composition according to the present invention is explained in detail below.

[Polycarbosilane]

Polycarbosilane is a polymer having a main chain composed of a repeating structure of silicon atom and carbon atom. The polycarbosilane according to the present invention contains repeating units similar to those of commonly known polycarbosilane, but it is characterized by molecular structure and can be specified by measuring NMR.

The ratio of the integrated intensity at 3.92 to 4.20 ppm to the integrated intensity at 3.60 to 5.50 ppm in the $^1$H-NMR spectrum of the polycarbosilane according to the present invention is 27 to 50%, preferably 27 to 45%, and more preferably 35 to 45%.

In a preferable embodiment of the present invention, for the polycarbosilane according to the present invention, the ratio of the integrated intensity at −25 to −5 ppm to the integrated intensity at −40 to 20 ppm in the $^{29}$Si-NMR spectrum is 38 to 50%, preferably 39 to 47%, and more preferably 39 to 44%, and the ratio of the integrated intensity at −24 to −5 ppm to the integrated intensity at −40 to 20 ppm in the DEPT$^{29}$Si-NMR spectrum is 70 to 92%, preferably 70 to 90%, and more preferably 70 to 89%.

Although not constrained by theory, the integrated intensity ratio of such an NMR spectrum is considered to correspond to the content of various substituents present in the polycarbosilane.

The peaks detected at 3.92 to 4.20 ppm in the $^1$H-NMR spectrum of the polycarbosilane correspond to the chemical shift of the structure characterized by the following structure (i), i.e. a structure wherein two hydrogen atoms are directly bonded to the Si atom. Further, the peaks detected at 3.60 to 5.50 ppm correspond to the chemical shifts of R$_3$SiH, R$_2$SiH$_2$ and RSiH$_3$ groups.

Further, the peaks detected at −25 to −5 ppm in the $^{29}$Si-NMR spectrum of the polycarbosilane correspond to the chemical shifts of the following chemical structures (ii) and (iii):

Further, the peaks detected at −40 to 20 ppm correspond to the chemical shifts of R$_4$Si, R$_3$SiMe, R$_2$Si (Me)$_2$, R$_3$SiH, the chemical structure (ii) and R$_2$SiHMe group.

The peaks detected at −24 to −5 ppm in the DEPT$^{29}$Si-NMR spectrum correspond to the chemical shift of above structure (iii).

Measurement methods of NMR ($^1$H-NMR, $^{29}$Si-NMR and DEPT$^{29}$Si-NMR) in the present invention are explained.

Figure 1:
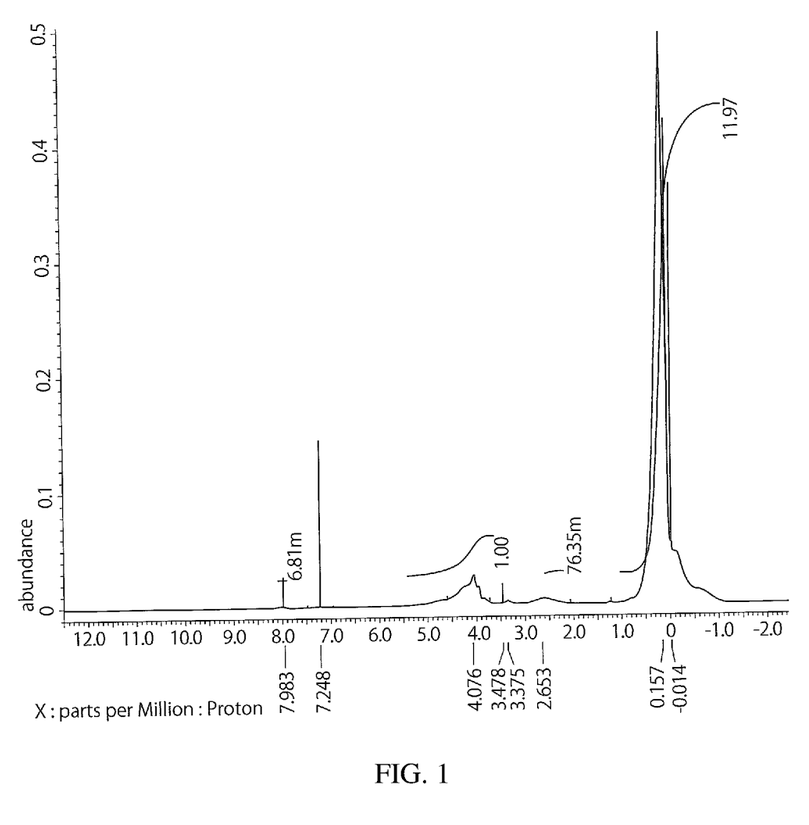
FIG. 1: a $^1$H-NMR spectrum of the polycarbosilane according to the present invention

The measurement of $^1$H-NMR can be carried out as follows:

The solvent is removed from the polycarbosilane obtained through synthesis with an evaporator, and 0.4 g of the obtained polycarbosilane is dissolved in 1.6 g of a deuterated solvent such as deuterochloroform to obtain a sample solution. The sample solution is measured 80 times using a nuclear magnetic resonance apparatus, JNM-ECS400 type (trade name, manufactured by JEOL Ltd.) to obtain a $^1$H-NMR spectrum. FIG. 1 is an example of $^1$H-NMR spectrum of the polycarbosilane according to the present invention obtained by this method.

In the present invention, for example, "integrated intensity at −25 to −5 ppm" means the integrated value of the spectrum in the range of −25 ppm to −5 ppm, that is, the area of the region surrounded by the curve and the baseline (where the intensity becomes 0) in FIG. 1.

Figure 2:
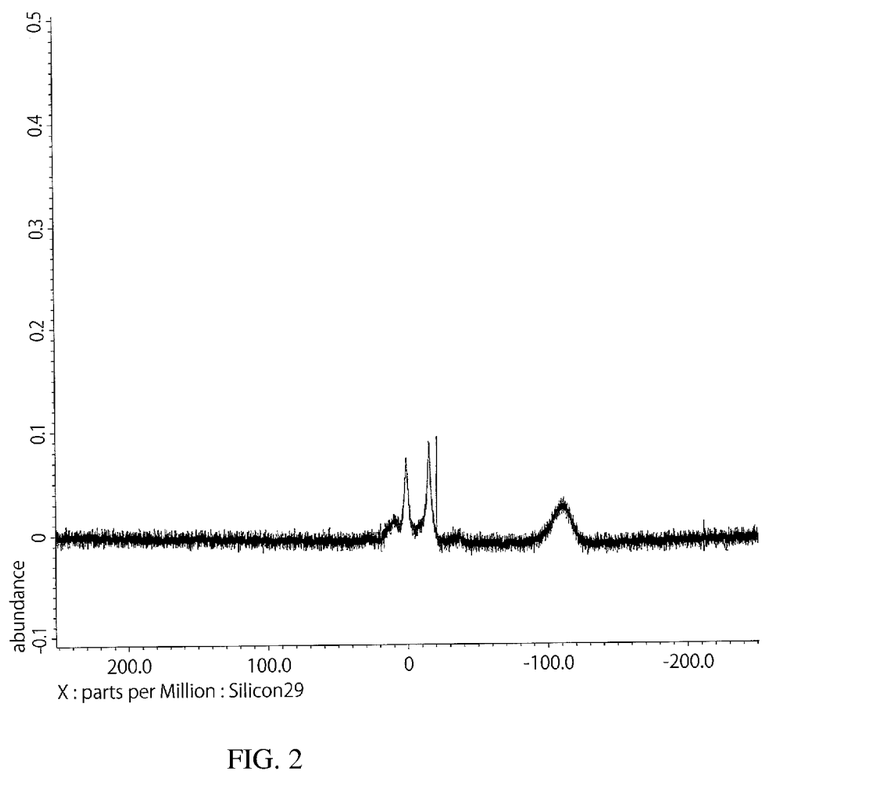
FIG. 2: a $^{29}$Si-NMR spectrum of the polycarbosilane according to the present invention

The measurement of $^{29}$Si-NMR can be specifically carried out as follows:

The solvent is removed from the polycarbosilane obtained through synthesis with an evaporator, and 0.4 g of the obtained polycarbosilane is dissolved in 1.6 g of a deuterated solvent such as deuterochloroform to obtain a sample solution. The sample solution is measured 1,000 times using a nuclear magnetic resonance apparatus, JNM-ECS400 type (trade name, manufactured by JEOL Ltd.) to obtain a $^{29}$Si-NMR spectrum. FIG. 2 is an example of $^{29}$Si-NMR spectrum of the polycarbosilane according to the present invention obtained by this method. In this NMR spectrum, peaks (in the vicinity of 20 to 5 ppm) assigned to R$_4$Si or R$_3$SiMe structure in the polycarbosilane, peaks (in the vicinity of 5 to −5 ppm) assigned to R$_2$SiMe$_2$ or R$_3$SiH structure in the polycarbosilane, or peaks (in the vicinity of −5 to −24 ppm) assigned to RSiHMe structure in the polycarbosilane and peaks (in the vicinity of −24 to −39 ppm) assigned to R$_2$SiH$_2$ structure in the polycarbosilane are observed.

Figure 3:
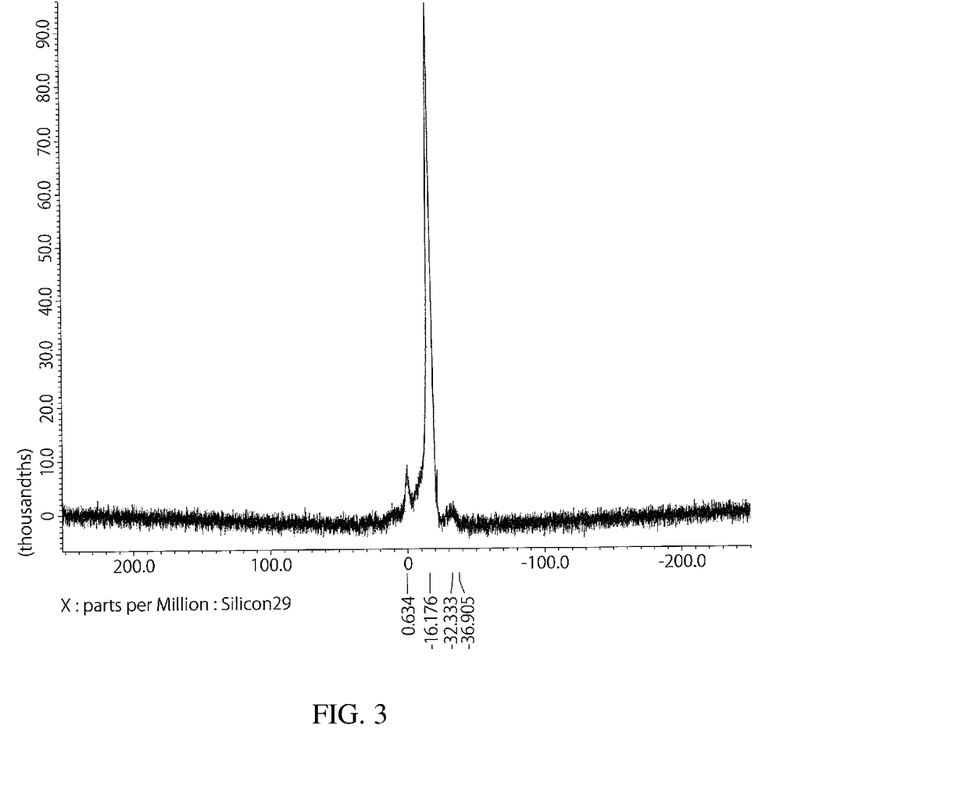
FIG. 3: a DEPT$^{29}$Si-NMR spectrum of the polycarbosilane according to the present invention

The measurement of DEPT$^{29}$Si-NMR can be specifically carried out as follows:

The solvent is removed from the polycarbosilane compound obtained through synthesis with an evaporator, and 0.4 g of the obtained polycarbosilane is dissolved in 1.6 g of a deuterated solvent such as deuterochloroform to obtain a sample solution. The sample solution is measured 2,000 times using a nuclear magnetic resonance apparatus, JNM-ECS400 type (trade name, manufactured by JEOL Ltd.) to obtain a DEPT$^{29}$Si-NMR spectrum. FIG. 3 is an example of DEPT$^{29}$Si-NMR spectrum of the polycarbosilane according to the present invention obtained by this method.

The polycarbosilane according to the present invention preferably comprises the following repeating unit (I):

wherein $R^a$ is substituted or unsubstituted, methylene or methine. Here, the substituted methylene or substituted methine means that a part or all of the hydrogen atoms thereof are substituted with halogen. In the formula, "$_{1/2}$" is formally used to express repeating units. That is, while $R^a$ is bonded to both sides of the Si atom, it is represented by "$_{1/2}$" that this $R^a$ is shared with other repeating unit. This also applies to the formula (II).

$R^a$ is preferably methylene or methine, in which a part or all of the hydrogen atoms are substituted by F, or unsubstituted methylene or methine, and more preferably unsubstituted methylene.

The ratio of the number of the Si atoms contained in the repeating unit (I) to the number of all of the Si atoms contained in the polycarbosilane is preferably 0.1 to 20%, more preferably 0.5 to 17%, and particularly preferably 1.9 to 14%.

Preferably, the polycarbosilane further comprises the following repeating unit (II):

wherein $R^b$ is substituted or unsubstituted, methylene or methine, and $R^c$ is each independently hydrogen, substituted or unsubstituted $C_1$-$C_6$ alkyl, substituted or unsubstituted $C_1$-$C_6$ alkenyl, or substituted or unsubstituted $C_6$-$C_{10}$ aryl. Here, the substitution in $R^b$ means that a part or all of the hydrogen atoms in methylene or methine are substituted by halogen, and the substitution in $R^c$ means that a part or all of the hydrogen atoms in $C_1$-$C_6$ alkyl, $C_1$-$C_6$ alkenyl or $C_1$-$C_{10}$ aryl are substituted with halogen.

$R^b$ is preferably methylene or methine, in which a part or all of the hydrogen atoms are replaced by F, or unsubstituted methylene or methine, and more preferably unsubstituted methylene.

$R^c$ is, for example, methyl, ethyl, propyl, phenyl, vinyl, allyl and the like, preferably methyl, ethyl and phenyl, and particularly preferably methyl.

The ratio of the number of the Si atoms contained in the repeating unit (II) to the number of all of the Si atoms contained in the polycarbosilane is preferably 30 to 50%, more preferably 32 to 48%, and particularly preferably 34 to 45%.

The ratio of the integrated intensity of the peak at 1080 to 1145 cm$^{-1}$ to the integrated intensity of the peak at 936 to 1077 cm$^{-1}$ in the infrared absorption spectrum of the polycarbosilane according to the present invention is preferably 0.6% or less, more preferably 0.5% or less, and particularly preferably 0.3% or less. While it is considered that the peak in the vicinity of 1080 to 1145 cm$^{-1}$ in the infrared absorption spectrum is a vibration due to Si—O—C structure, the polycarbosilane according to the present invention is preferred to have less such a structure because of flowability at heating.

In the present invention, the measurement of the infrared absorption spectrum can specifically be measured as follows:

The polycarbosilane obtained through synthesis was dissolved in dibutyl ether, coated on a silicon wafer using a spin coater 1H-360, manufactured by Mikasa Co., Ltd., and measured with an ellipsometer (M-44, manufactured by J. A. Woollam Co., Inc.). It was confirmed that each sample had a constant film thickness (about 600 nm), and the infrared absorption spectrum of the film was measured using FTIR6100, manufactured by JASCO Corporation.

The structure of the polycarbosilane according to the present invention has or does not have a branched structure or a cyclic structure in the molecule, but a cyclic structure is preferable.

The polycarbosilane according to the present invention needs to have a specific molecular weight. In order to improve the coatability of the composition containing the polycarbosilane according to the present invention and to prevent film thickness reduction of the coated film during a drying step, it is preferable that the polycarbosilane has a larger mass average molecular weight within a range that the polycarbosilane has melting point. Further, in order to improve the filling property of the composition into the trench, it is preferable that the polycarbosilane has a smaller mass average molecular weight. From this viewpoint, the mass average molecular weight of the polycarbosilane is preferably 1,000 to 4,500, more preferably 1,000 to 4,000, and particularly preferably 1,100 to 3,800. Here, the mass average molecular weight is a mass average molecular weight in terms of polystyrene, which can be measured by the gel permeation chromatography based on polystyrene.

The polycarbosilane according to the present invention has a melting point of preferably 350° C. or less, more preferably 300° C. or less, and particularly preferably 250° C. or less.

Two or more kinds of polycarbosilane can be used in combination in the composition according to the present invention, if necessary.

[Solvent]

The composition according to the invention comprises a solvent. Examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether (PGME) and propylene glycol monoethyl ether; propylene glycol alkyl ether acetates, such as propylene glycol monomethyl ether acetate (PGMEA), propylene glycol monoethyl ether acetate and propylene glycol monopropyl ether acetate; aromatic hydrocarbons, such as benzene, toluene and xylene; ketones such as methyl ethyl ketone, acetone, methyl amyl ketone, methyl isobutyl ketone and cyclohexanone; alcohols such as isopropanol and propane diol; and the like, but it is not limited to these. These solvents are used singly or in combination of two or more kinds.

So as to improve workability by the coating method employed and taking account of the permeability of the solution into a fine trench and the film thickness required in the outer part of the trench, the amount of the solvent to be blended into the composition can be appropriately selected according to the mass average molecular weight of polycarbosilane, its distribution and structure. The composition according to the invention generally comprises polycarbosilane of 0.5 to 80% by mass, preferably 2 to 60% by weight, and more preferably 5 to 30% by mass, based on the total mass of the composition.

The composition according to the present invention essentially comprises a polycarbosilane and a solvent, but further compounds can be combined, if necessary. These materials that can be combined are explained as follows. In addition, the components other than the polycarbosilane and the solvent in the whole composition are preferably 5% or less, more preferably 3% or less, and particularly preferably 1% or less, based on the total mass.

[Surfactant]

In order to improve coatability, a surfactant may be used in the composition of the present invention. As the surfactant, an optional one can be used. Examples of the surfactant that can be used in the present invention include (A) anionic surfactant, (B) cationic surfactant, or (C) nonionic surfactant. More specifically, (A) alkylsulfonate, alkylbenzenesulfonic acid, and alkylbenzene sulfonate, (B) lauryl pyridinium chloride, and lauryl methyl ammonium chloride, and (C) polyoxyethylene octyl ether, polyoxyethylene lauryl ether, and polyoxyethylene acetylenic glycol ether are preferred. These surfactants, for example, a nonionic surfactant such as nonionic alkyl ether type surfactant manufactured by Nippon Nyukazai Co., Ltd. etc., are commercially available.

[Other Additives]

In the composition according to the present invention, other optional additives can be used as long as the effect of the present invention is not impaired. One of these additives is a plasticizer such as ethylene glycol, glycerin and triethyl glycol. A leveling agent or the like can also be used.

The solid content concentration of the composition according to the present invention is preferably 3 to 50% by mass, more preferably 5 to 30% by mass, and can be adjusted depending on the intended film thickness.

<Method for Manufacturing Silicon Carbonaceous Film>

The method for manufacturing a silicon carbonaceous film according to the present invention comprises applying said composition on a substrate and curing it by heating.

[Coating Step]

First, the composition is applied on a substrate to form a coated film. The method for applying the composition on the substrate can be freely selected from a conventionally known method such as a spin coating method, a dipping method, a spraying method, a transferring method, a roll coating, a bar coating, a brush coating, a doctor coating, a flow coating and a slit coating. As the substrate on which the composition is applied, a suitable substrate such as a silicon substrate, a glass substrate and a resin film can be used. Various semiconductor elements and the like can be formed on these substrates as necessary.

The shape of the substrate is not particularly limited, and it can be freely selected depending on the purpose. However, the composition according to the present invention is characterized by excellent filling property, so that it is preferably applied on a substrate having trench portions and holes of a high aspect ratio. Specifically, it is preferably applied on a substrate having at least one trench having a width of the deepest portion of 50 nm or less and an aspect ratio of 10 or more. The shape of the trench is not particularly limited, and the cross section thereof is any of a rectangle, a forward tapered shape, a reverse tapered shape, a curved surface shape, and the like. Both end portions of the trench may be opened or closed.

[Drying Step]

After the application of the composition, if desired, it can be subjected to a drying step for the purpose of removing a part or all of the solvent contained in the coated film. The drying can be carried out, for example, by placing it for 5 seconds to 60 minutes in the atmosphere, which is in the air, in vacuum, under reduced pressure, or in an inert gas or oxygen at 100 to 300° C., preferably lower than 250° C. Further, after the treatment in vacuum, under reduced pressure or in inert gas, it is also possible subsequently to carry out the treatment in the air or in oxygen. In this step, while the treatment is carried out at a temperature substantially not causing a substantial curing reaction as described below and the solvent is removed, the planarity of the finally obtained film tends to be improved. The process that is carried out at a temperature at occurring a substantial curing reaction and in which the solvent removal and the curing reaction proceed in parallel is to be classified as a curing step as described below.

[Curing Step]

Next, a curing step is subjected in order to react the polycarbosilane in the coated film to produce a film. The curing here means that the SiOH group remaining in the polycarbosilane is densified by a condensation reaction. The curing step is carried out, for example, by heating the coated film. The heating is performed at a temperature of 150 to 1,200° C., more preferably 200 to 650° C., particularly preferably 250 to 450° C., and most preferably 250 to 350° C. There is no particular limitation on the heating rate to the target temperature and the cooling rate, but generally it can be in the range of 1 to 100° C./min. Further, there is no particular limitation either about the heating and holding time after reaching the target temperature and it can be generally in the range of 1 minute to 10 hours, preferably 1 to 120 minutes, and more preferably 1 to 60 minutes. Further, the atmosphere at heating is not particularly limited, but it can be in the air, in an inert gas such as nitrogen, under vacuum, under reduced pressure, in oxygen gas, or in water vapor. Further, the heat treatment can be performed in any of these atmospheres, and subsequently heating can be performed under a different atmosphere. Among them, the preferable atmosphere is that in an inert gas, particularly preferably in nitrogen gas.

By the above-described curing step, condensation polymerization of polycarbosilane is carried out and it is converted to a silicon carbonaceous film. The silicon carbonaceous film according to the present invention is one in which polycarbosilane is cured by heating and part of carbon in the polycarbosilane is replaced with oxygen. Among the carbon atoms contained in the polycarbosilane, preferably 1 to 25%, more preferably 3 to 20%, and particularly preferably 5 to 15% thereof are replaced with oxygen atoms after film formation.

The polycarbosilane according to the present invention is characterized by being able to form a film by heating at a lower temperature as compared with the prior art. This is because there are more $SiH_2$ structures in the polycarbosilane according to the present invention than the conventional polycarbosilane and they can easily react with water vapor or oxygen in the air.

The film thickness of the produced silicon carbonaceous film is not particularly limited, but it is usually 10 to 4,000 nm, preferably 50 to 3,000 nm.

The silicon carbonaceous film thus produced can be used as, for example, an insulating film, a hard mask, an etching stopper and an anti-metal diffusion film.

A method for producing an electronic device according to the present invention comprises the above-described method for producing a silicon carbonaceous film <Method for Producing a Polycarbosilane>

Polycarbosilane can be generally produced by subjecting polydimethylsilane to a thermal rearrangement reaction under 3.0 to 7.0 MPa in a nitrogen atmosphere at 400 to 500° C. In the method for producing a polycarbosilane according to the present invention, a desired polycarbosilane can be obtained, in particular, by including a step of heat-treating the polydimethylsilane under the condition of 0.15 to 0.9 MPa and at 700° C. or more.

The present invention is described below by use of examples. The embodiments of the present invention are not limited to these examples.

<Polydimethylsilane>

390 g of metallic sodium was heated to 100° C. or more in 2.5 L of xylene under a nitrogen stream, stirred, and melted. 1,100 g of dichlorodimethylsilane was added dropwise thereto, and the mixture was stirred under reflux at 120 to 140° C. for 12 hours. As a result, a purple precipitate was obtained. After xylene was filtered off, methanol was added to this precipitate, the mixture was stirred, and a treatment to inactivate residual metallic sodium was carried out. Further, 3 L of pure water was added, and stirring and filtration were repeated twelve times to remove by-product sodium chloride. The product was dried in a vacuum drier at 90° C. and 5 mmHg, for 24 hours to obtain 420 g of white powdery polydimethylsilane.

<Polycarbosilane A>

300 g of the polydimethylsilane obtained above was placed in a porcelain crucible and set it in a pressurization atmospheric furnace. After replacing the air with nitrogen gas, pressurized reaction at 720° C. under 0.8 MPa for 12 hours was carried out to obtain 205 g (yield: 68%) of a pressurized reaction product. This pressurized reaction product was dissolved in 500 mL of n-hexane and filtered. The resulting n-hexane solution was added dropwise to 1,200 mL of ethanol being stirred. The precipitate was filtered off and the solvent was distilled off under reduced pressure to obtain 66 g of a pale yellow solid. The yield was 22% based on polydimethylsilane.

<Polycarbosilane B>

The pressurized reaction product obtained by the method described for polycarbosilane A was dissolved in 500 mL of n-hexane and filtered. The resulting n-hexane solution was added dropwise to 750 mL of ethanol being stirred. The precipitate was filtered off and the solvent was distilled off under reduced pressure to obtain 84 g of a pale yellow solid. The yield was 28% based on polydimethylsilane.

<Polycarbosilane C> 300 g of the polydimethylsilane obtained above was placed in a porcelain crucible and set it in a pressurization atmospheric furnace. After replacing the air with nitrogen gas, pressurized reaction at 750° C. under 0.5 MPa for 12 hours was carried out. 210 g (yield: 70%) of a pressurized reaction product was obtained. This pressurized reaction product was dissolved in 500 mL of n-hexane and filtered. The resulting n-hexane solution was added dropwise to 1,000 mL of ethanol being stirred. The precipitate was filtered off and the solvent was distilled off under reduced pressure to obtain 96 g of a pale yellow solid. The yield was 32% based on polydimethylsilane.

<Polycarbosilane D>

The pressurized reaction product obtained by the method described for polycarbosilane C was dissolved in 500 mL of n-hexane, filtered, and then the n-hexane solution was added dropwise to 700 mL of ethanol being stirred. The precipitate was filtered off and the solvent was distilled off under reduced pressure to obtain 99 g of a pale yellow solid. The yield was 33% based on polydimethylsilane.

<Polycarbosilane E>

300 g of the polydimethylsilane obtained above was placed in a porcelain crucible and set in a pressurization atmospheric furnace. After replacing the air with nitrogen gas, pressurized reaction at 780° C. under 0.2 MPa for 12 hours was carried out. 216 g (yield: 72%) of a pressurized reaction product was obtained. This pressurized reaction product was dissolved in 500 mL of n-hexane, filtered, and then the n-hexane solution was added dropwise to 500 mL of ethanol being stirred. The precipitate was collected and dissolved again in n-hexane, and then the solvent was distilled off under reduced pressure to obtain 114 g of a pale yellow solid. The yield was 38% based on polydimethylsilane.

<Polycarbosilane F>

The above polycarbosilane B and polycarbosilane E were mixed at a ratio of 3:1 to give polycarbosilane F.

<Polycarbosilane G>

300 g of the polydimethylsilane obtained above was placed in an autoclave having an internal volume of 1 L, air was replaced with nitrogen gas, and thereafter pressurized reaction at 480° C. under 4 MPa for 12 hours was carried pout. 195 g (yield 65%) of a pressurized reaction product was obtained. This pressurized reaction product was dissolved in 500 mL of n-hexane, filtered, and then the n-hexane solution was added dropwise to 750 mL of ethanol being stirred. The precipitate was collected, dissolved again in n-hexane, and then the solvent was distilled off under reduced pressure to obtain 126 g of a pale yellow solid. The yield was 42% based on polydimethylsilane.

<Polycarbosilane H>

The pressure reaction product obtained in the same manner as in Polycarbosilane G was dissolved in 500 mL of n-hexane, filtered, and then the n-hexane solution was added dropwise to 1,500 mL of ethanol being stirred. The precipitate was collected and dissolved again in n-hexane, and the solvent was distilled off under reduced pressure to obtain 117 g of a pale yellow solid. The yield was 39% based on polydimethylsilane.

With respect to the polycarbosilane A to G, an absorption due to C—H at 2990 $cm^{-1}$, 2920 $cm^{-1}$, 1360 $cm^{-1}$ and 1020 $cm^{-1}$, an absorption due to Si—H at 2100 $cm^{-1}$ and an absorption due to Si—$CH_3$ at 1200 $cm^{-1}$ and 830 $cm^{-1}$ were observed from FT-IR, and it was confirmed that the products were polycarbosilane.

The properties of polycarbosilane A to G are as shown in Table 1 below.

Here, the mass average molecular weight was measured by a GPC system manufactured by Shimadzu Corporation, and tetrahydrofuran was used as an eluent. Further, for the measurement of the melting point, a fully automated melting point measuring apparatus (MP90 type) manufactured by Mettler was used. Powder material of 325 mesh or less was filled in a glass capillary having an inner diameter of 1 mm with a filling density of 0.54 to 0.57 $g/cm^3$ to a height of 4.0 to 4.5 mm, and the light transmittance was measured at a heating rate of 10° C./min. The melting point was taken as the temperature of the inflection point at which the sample melted and the light transmittance curve sharply increased.

TABLE 1

| polycarbosilane | mass average molecular weight | melting point (° C.) | $^1$H-NMR integrated intensity ratio | $^{29}$Si-NMR integrated intensity ratio | DEPT$^{29}$Si-NMR integrated intensity ratio |
| --- | --- | --- | --- | --- | --- |
| polycarbosilane A | 1130 | 80 | 30% | 39% | 81% |
| polycarbosilane B | 1360 | 83 | 43% | 43% | 80% |
| polycarbosilane C | 1780 | 142 | 29% | 41% | 81% |
| polycarbosilane D | 2130 | 220 | 30% | 40% | 89% |
| polycarbosilane E | 3680 | 245 | 28% | 42% | 77% |
| polycarbosilane F | 1940 | 196 | 35% | 41% | 78% |
| polycarbosilane G | 5060 | 360 | 26% | 36% | 98% |
| polycarbosilane H | 7650 | none | 25% | 37% | 93% |

In the table,
$^1$H-NMR integrated intensity ratio shows the ratio of the integrated intensity at 3.92 to 4.20 ppm to the integrated intensity at 3.60 to 5.50 ppm in the $^1$H-NMR spectrum,
$^{29}$Si-NMR integrated intensity ratio shows the ratio of the integrated intensity at −25 to −5 ppm to the integrated intensity at −40 to 20 ppm in the $^{29}$Si-NMR spectrum, and
DEPT$^{29}$Si-NMR integrated intensity ratio shows the ratio of the integrated intensity at −24 to −5 ppm to the integrated intensity at −40 to 20 ppm in the DEPT$^{29}$Si-NMR spectrum.

Examples 1 to 6, Comparative Examples 1 and 2

The polycarbosilane A to F obtained above were respectively dissolved in dibutyl ether and silicon carbonaceous film forming compositions were prepared so as to obtain a film thickness of 600 nm by coating them on a silicon wafer at 1,000 rpm using a spin coater 1H-360, manufactured by Mikasa Co., Ltd. The obtained compositions were applied on a silicon wafer at 1,000 rpm and then silicon carbonaceous films were obtained by curing by means of heat treatment in $N_2$ at 260° C. for 2 minutes, subsequently in the air at 300° C. for 3 minutes, and subsequently in $N_2$ at 450° C. for 60 minutes. The respective film thicknesses are as shown in Table 2 below. The film thickness was measured using an ellipsometer (M-44, manufactured by J. A. Woollam Co., Inc.) for the silicon carbonaceous films. The film surface of each silicon carbonaceous film was observed by means of an optical microscope, and no cracks were confirmed.

Example 7

Using the polycarbosilane B obtained above, a silicon carbonaceous film forming composition was prepared in the same manner as described above. The obtained composition was coated on a silicon wafer at 1,000 rpm and then cured by means of heat treatment in $N_2$ at 320° C. for 60 minutes to obtain a silicon carbonaceous film. The measurement results of the film thickness were as shown in Table 2, and no cracks were confirmed as with the above.

Example 8

Using the polycarbosilane B obtained above, a silicon carbonaceous film forming composition was prepared in the same manner as described above. The obtained composition was coated on a silicon wafer at 1,000 rpm and then cured by means of heat treatment under reduced pressure (0.6 Pa) at 300° C. for 60 minutes to obtain a silicon carbonaceous film. The measurement results of the film thickness were as shown in Table 2, and no cracks were confirmed as with the above.

[Evaluation of Electrical Property]

Using the obtained silicon carbonaceous film, dielectric constant and breakdown electric field were measured. The dielectric constant was measured using a mercury probe tool (MCV-530), manufactured by Semilab Inc.

Further, the breakdown electric field was measured using SSM495 272A-M100, manufactured by Japan SSM K.K. The electric field when the current density exceeds $1E^{-6}$ (A/cm$^2$) was taken as Fbd (MV/cm). The obtained results were as shown in Table 2.

[Evaluation of Filling Property]

A silicon substrate having a trench structure with a width of 50 nm and a depth of 500 nm on the surface was prepared. The above-described silicon carbonaceous film forming composition was applied on the silicon substrate by spin coating and subjected to the same heat treatment as above to prepare a silicon substrate with a silicon carbonaceous film. The silicon substrate with a silicon carbonaceous film was cut perpendicularly to the trench direction and the cross section was observed for the presence or absence of vacancy (void) in the trench by a scanning electron microscope. The obtained results were as shown in Table 2.

[Evaluation of Planarity]

A silicon substrate having a trench structure with a width of 1,800 nm and a depth of 500 nm on the surface was prepared. The compositions of Examples and Comparative Examples were applied by spin coating, and the same heat treatment as above was carried out to prepare silicon substrates with a silicon carbonaceous film. The silicon substrates with a silicon carbonaceous film were cut perpendicularly to the trench direction and the film thickness in the trench was measured with a scanning electron microscope capable of length measuring in the cross section. The difference between the film thickness from the trench bottom portion in the trench side wall portion and the film thickness from the trench bottom portion in the trench central portion was measured. The differences were shown in Table 2. It was evaluated that the smaller the difference, the better the planarity.

TABLE 2

| | polycarbosilane | film thickness (nm) | dielectric constant | Fbd (MV/cm) | filling property | planarity (nm) |
|---|---|---|---|---|---|---|
| Example 1 | polycarbosilane A | 653 | 3.25 | 3.5 | no void | 0 |
| Example 2 | polycarbosilane B | 586 | 2.68 | 5.0 | no void | 0 |
| Example 3 | polycarbosilane C | 605 | 2.86 | 4.2 | no void | 0 |
| Example 4 | polycarbosilane D | 607 | 2.45 | 4.6 | no void | 0 |
| Example 5 | polycarbosilane E | 599 | 3.18 | 3.5 | no void | 0 |
| Example 6 | polycarbosilane F | 617 | 3.43 | 3.5 | no void | 0 |
| Example 7 | polycarbosilane B | 618 | 3.06 | 4.7 | no void | 0 |
| Example 8 | polycarbosilane B | 632 | 2.90 | 5.3 | no void | 0 |
| Comparative Example 1 | polycarbosilane G | 652 | 3.55 | 2.0 | void | 139 |
| Comparative Example 2 | polycarbosilane H | 613 | 3.68 | 2.9 | void | 152 |

The invention claimed is:

1. A silicon carbonaceous film forming composition comprising a polycarbosilane and a solvent, wherein the ratio of the integrated intensity at 3.92 to 4.20 ppm to the integrated intensity at 3.60 to 5.50 ppm in the $^1$H-NMR spectrum of said polycarbosilane is 27 to 50%.

2. The composition according to claim 1, wherein for said polycarbosilane, the ratio of the integrated intensity at −25 to −5 ppm to the integrated intensity at −40 to 20 ppm in the $^{29}$Si-NMR spectrum is 38 to 50%, and the ratio of the integrated intensity at −24 to −5 ppm to the integrated intensity at −40 to 20 ppm in the DEPT$^{29}$Si-NMR spectrum is 70 to 92%.

3. The composition according to claim 1, wherein said polycarbosilane comprises the following repeating unit (I):

(I)

wherein $R^a$ is substituted or unsubstituted, methylene or methine.

4. The composition according to claim 3, wherein said $R^a$ is methylene or methine, which is substituted by F.

5. The composition according to claim 3, wherein said $R^a$ is unsubstituted methylene.

6. The composition according to claim 3, wherein the ratio of the number of the Si atoms contained in the repeating unit (I) to the number of all of the Si atoms contained in said polycarbosilane is 0.1 to 20%.

7. The composition according to claim 3, wherein said polycarbosilane further comprises the following repeating unit (II):

(II)

wherein $R^b$ is substituted or unsubstituted, methylene or methine, and $R^c$ is each independently hydrogen, substituted or unsubstituted $C_1$-$C_6$ alkyl, substituted or unsubstituted $C_1$-$C_6$ alkenyl, or substituted or unsubstituted $C_6$-$C_{10}$ aryl.

8. The composition according to claim 7, wherein said $R^b$ is methylene or methine, which is substituted by F.

9. The composition according to claim 7, wherein said $R^b$ is unsubstituted methylene and said $R^c$ is unsubstituted methyl.

10. The composition according to claim 7, wherein the ratio of the number of the Si atoms contained in the repeating unit (II) to the number of all of the Si atoms contained in said polycarbosilane is 30 to 50%.

11. The composition according to claim 1, wherein the mass average molecular weight of said polycarbosilane is 1,000 to 4,500.

12. The composition according to claim 1, wherein the ratio of the integrated intensity of the peak at 1080 to 1145 cm$^{-1}$ to the integrated intensity of the peak at 936 to 1077 cm$^{-1}$ in the infrared absorption spectrum of said polycarbosilane is 0.6% or less.

13. A method for producing a silicon carbonaceous film, comprising applying the composition according to claim 1 on a substrate and curing it by heating.

14. The method for producing a silicon carbonaceous film according to claim 13, wherein said heating is performed at 200 to 650° C.

15. A method for producing an electronic device, comprising the method for producing a silicon carbonaceous film according to claim 13.

16. A method for producing polycarbosilane, comprising a step of heat-treating polydimethylsilane under the condition of 0.15 to 0.9 MPa and at 700° C. or more.

17. The method according to claim 16, wherein the ratio of the integrated intensity at 3.92 to 4.20 ppm to the integrated intensity at 3.60 to 5.50 ppm in the H-NMR spectrum of said polycarbosilane is 27 to 50%.

* * * * *